(12) United States Patent
Wojcik et al.

(10) Patent No.: US 11,189,990 B2
(45) Date of Patent: Nov. 30, 2021

(54) SEMICONDUCTOR LASER COMPONENT AND METHOD OF PRODUCING A SEMICONDUCTOR LASER COMPONENT

(71) Applicant: OSRAM OLED GmbH, Regensburg (DE)

(72) Inventors: Andreas Wojcik, Regensburg (DE); Hubert Halbritter, Dietfurt (DE); Thomas Schwarz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 133 days.

(21) Appl. No.: 16/615,452

(22) PCT Filed: May 18, 2018

(86) PCT No.: PCT/EP2018/063069
§ 371 (c)(1),
(2) Date: Nov. 21, 2019

(87) PCT Pub. No.: WO2018/219687
PCT Pub. Date: Dec. 6, 2018

(65) Prior Publication Data
US 2020/0176948 A1    Jun. 4, 2020

(30) Foreign Application Priority Data

Jun. 2, 2017   (DE) ........................ 102017112223.0

(51) Int. Cl.
*H01S 5/0231*    (2021.01)
*H01S 5/0234*    (2021.01)
(Continued)

(52) U.S. Cl.
CPC .......... *H01S 5/02345* (2021.01); *H01L 24/19* (2013.01); *H01L 24/24* (2013.01);
(Continued)

(58) Field of Classification Search
CPC .. H01S 5/02234; H01S 5/0231; H01S 5/0282; H01S 5/0236; H01S 5/022;
(Continued)

(56) References Cited

U.S. PATENT DOCUMENTS 6,770,960 B2 *   8/2004   Oohata ................... H01L 24/24
                                                              257/678
8,552,459 B2 *  10/2013   Herrmann .............. C08G 61/02
                                                              257/99

(Continued)

FOREIGN PATENT DOCUMENTS

CA       2 356 323       5/2001
CN      101971344 A      2/2011
(Continued)

OTHER PUBLICATIONS

Dragoi, V. et al.: "Adhesive Wafer Bonding Using Photosensitive Polymer Layers," Presented at SPIE—Microtechnologies for the New Millenium, symposia "Smart Sensors, Actuators, and MEMS," May 4-6, 2009, Dresden, Germany, 9 pages.
(Continued)

*Primary Examiner* — Tuan N Nguyen
(74) *Attorney, Agent, or Firm* — DLA Piper LLP (US)

(57) ABSTRACT

A semiconductor laser component including a semiconductor chip arranged to emit laser radiation, a cladding that is electrically insulating and covers the semiconductor chip in places, and a bonding layer that electrically conductively connects the semiconductor chip to a first connection point, wherein the semiconductor chip includes a cover surface, a bottom surface, a first front surface, a second front surface, a first side surface and a second side surface, the first front surface is arranged to decouple the laser beam, the cladding covers the semiconductor chip at least in places on the cover surface, the second front surface, the first side surface and the second side surface, and the bonding layer on the
(Continued)

cladding extends from the cover surface to the first connection point.

17 Claims, 5 Drawing Sheets

(51) Int. Cl.
| | |
|---|---|
| H01S 5/02234 | (2021.01) |
| H01S 5/0232 | (2021.01) |
| H01S 5/0236 | (2021.01) |
| H01S 5/0233 | (2021.01) |
| H01L 23/00 | (2006.01) |
| H01S 5/042 | (2006.01) |
| H01S 5/02345 | (2021.01) |
| H01S 5/028 | (2006.01) |

(52) U.S. Cl.
CPC ............ *H01L 24/32* (2013.01); *H01S 5/0231* (2021.01); *H01S 5/0232* (2021.01); *H01S 5/0233* (2021.01); *H01S 5/0234* (2021.01); *H01S 5/0236* (2021.01); *H01S 5/02234* (2021.01); *H01L 2224/24226* (2013.01); *H01L 2224/32235* (2013.01); *H01S 5/0282* (2013.01); *H01S 5/0428* (2013.01)

(58) Field of Classification Search
CPC ............ H01S 5/02255; H01S 5/02216; H01S 5/0428; H01S 5/0232; H01L 2224/245; H01L 2224/32235; H01L 2924/01081; H01L 2224/24105; H01L 2224/24246; H01L 23/00
USPC ..................................................... 372/43.01
See application file for complete search history.

(56) References Cited

U.S. PATENT DOCUMENTS

| | | | |
|---|---|---|---|
| 8,710,537 B2 | 4/2014 | Engl et al. | |
| 9,577,406 B2 | 2/2017 | Canumalla et al. | |
| 9,645,408 B2 | 5/2017 | Chern et al. | |
| 2003/0160258 A1 | 8/2003 | Oohata | |
| 2006/0261292 A1* | 11/2006 | Kim | H01L 33/54 250/551 |
| 2009/0065800 A1 | 3/2009 | Wirth et al. | |
| 2010/0133564 A1 | 6/2010 | Herrmann et al. | |
| 2010/0163915 A1 | 7/2010 | Herrmann et al. | |
| 2011/0278621 A1* | 11/2011 | Herrmann | H01L 24/24 257/98 |
| 2014/0227811 A1* | 8/2014 | Gebuhr | H01L 24/82 438/26 |
| 2014/0262442 A1 | 9/2014 | Nomura et al. | |
| 2014/0319547 A1 | 10/2014 | Rode et al. | |
| 2017/0005234 A1 | 1/2017 | Fehrer et al. | |

FOREIGN PATENT DOCUMENTS

| | | |
|---|---|---|
| CN | 104040738 A | 9/2014 |
| CN | 104051408 A | 9/2014 |
| CN | 105207052 A | 12/2015 |
| CN | 106471686 A | 3/2017 |
| DE | 199 52 712 | 5/2001 |
| DE | 10 2004 024 156 | 10/2005 |
| DE | 102008057350 A1 | 5/2010 |
| DE | 10 2009 058 796 | 6/2011 |
| TW | 201622281 A | 6/2016 |
| WO | 2018/192857 | 10/2018 |

OTHER PUBLICATIONS

The First Office Action dated Sep. 3, 2020, of counterpart Chinese Application No. 201880035952.3, along with an English translation.
Notification of Grant Patent Right for Invention dated Apr. 21, 2021, of counterpart Chinese Application No. 201880035952.3, along with an English translation.

* cited by examiner

SEMICONDUCTOR LASER COMPONENT AND METHOD OF PRODUCING A SEMICONDUCTOR LASER COMPONENT

TECHNICAL FIELD

This disclosure relates to a semiconductor laser component and a method of producing such components.

BACKGROUND

DE 10 2004 024156 describes a semiconductor laser component. There is nonetheless a need to provide a semiconductor laser component that is particularly compact and a method of producing such a semiconductor laser component.

SUMMARY

We provide a semiconductor laser component including a semiconductor chip arranged to emit laser radiation, a cladding that is electrically insulating and covers the semiconductor chip in places, and a bonding layer that electrically conductively connects the semiconductor chip to a first connection point, wherein the semiconductor chip includes a cover surface, a bottom surface, a first front surface, a second front surface, a first side surface and a second side surface, the first front surface is arranged to decouple the laser beam, the cladding covers the semiconductor chip at least in places on the cover surface, the second front surface, the first side surface and the second side surface, and the bonding layer on the cladding extends from the cover surface to the first connection point.

We also provide a method of producing a semiconductor laser component including: mounting a semiconductor chip on a carrier, covering the semiconductor chip with a cladding, whereby only a bottom surface of the semiconductor chip remains free of the cladding, exposing a cover surface of the semiconductor chip in places, and applying a bonding layer to a top side of the cladding facing away from the carrier and to the cover surface of the semiconductor chip.

We further provide a semiconductor laser component including a semiconductor chip arranged to emit laser radiation, a cladding that is electrically insulating and covers the semiconductor chip in places, and a bonding layer that electrically conductively connects the semiconductor chip to a first connection point, wherein the semiconductor chip includes a cover surface, a bottom surface, a first front surface, a second front surface, a first side surface and a second side surface, the first front surface is arranged to decouple the laser beam, the cladding covers the semiconductor chip at least in places on the cover surface, the second front surface, the first side surface and the second side surface, the bonding layer on the cladding extends from the cover surface to the first connection point, and the cladding projects beyond the first front surface in a direction perpendicular to or transverse to the first front surface.

Figure 1:
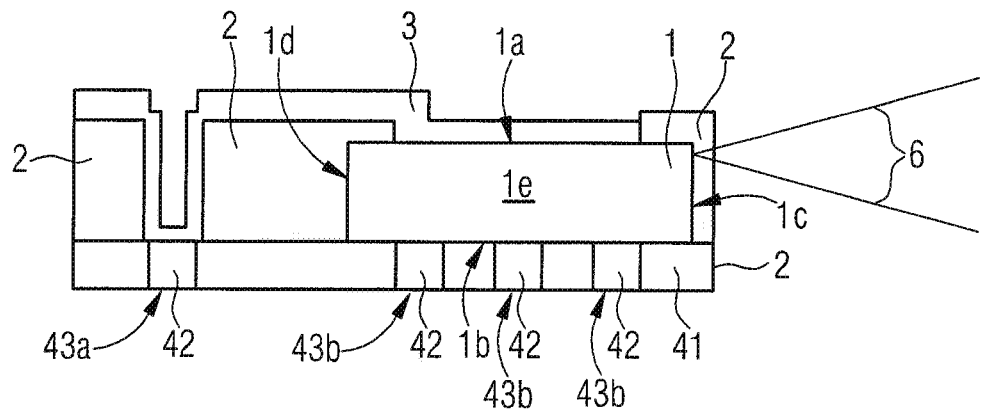
FIGS. 1, 2, 3A, 3B, 4, 5, 6, 7A, 7B and 7C show examples of components described herein using schematic diagrams.

LIST OF REFERENCE SIGNS 1 semiconductor chip
1a cover surface
1b bottom surface
1c first front surface
1d second front surface
1e first side surface
1f second side surface
2 cladding
21 opening
3 bonding layer
4 carrier
41 base body
42 via
43a first connection point
43b second connection point
44a first connection frame part
44b second connection frame part
45a first contact point
45b second contact point
5 casting body
6 electromagnetic radiation
7 mounting element
h1 thickness of the semiconductor chip
h2 thickness of the cladding

DETAILED DESCRIPTION

The semiconductor laser component may comprise a semiconductor chip arranged to emit laser radiation. This means that, during operation, the semiconductor chip emits electromagnetic radiation, for example, in the spectral range between infrared radiation and UV radiation. In particular, electromagnetic radiation has a large coherence length. For example, the semiconductor chip is arranged to generate pulsed laser radiation during operation. The pulse length can be in the picosecond or femtosecond range.

In particular, the semiconductor chip is an edge-emitting semiconductor laser chip in which laser radiation exits at a front surface, i.e. a facet, of the semiconductor chip.

The component may comprise a cladding that is electrically insulating and covers the semiconductor chip in places. For example, the cladding comprises an electrically insulating matrix material into which particles of other materials can be incorporated. The cladding may be electrically insulating and can border directly on the semiconductor chip in places. It is possible that the cladding borders directly on a semiconductor material, a contact material and/or a passivation material of the semiconductor chip.

The semiconductor laser component may comprise a bonding layer that electrically conductively connects the semiconductor chip to a first connection point of the semiconductor laser component. The bonding layer is a layer of electrically conductive material which, for example, comprises a metal or combinations of several metals. The layer may have a thickness that can be at least 1 μm to at most 15 μm, for example. The thickness of the bonding layer may be constant within the producing tolerance over the entire length of the bonding layer.

Furthermore, the bonding layer has a width that is large compared to the thickness of the bonding layer. The width of the bonding layer can be, for example, in the order of one edge length of the semiconductor chip, for example, the edge length at a front surface of the semiconductor chip. For example, the width of the bonding layer is at least 0.1 mm and not more than 1 mm. The bonding layer can be produced by sputtering and/or deposition, for example electroless or galvanic deposition.

The semiconductor chip may comprise a cover surface, a bottom surface, a first front surface, a second front surface, a first side surface and a second side surface. It is possible that the semiconductor chip has a cuboid shape and, apart from the surfaces mentioned above, does not comprise any other outer surfaces. The cover surface may be opposite the bottom surface, the first front surface may be opposite the second front surface and the first side surface may be opposite the second side surface. The front surfaces can enclose an angle with the cover surface, the bottom surface and the side surfaces which, for example, is 85° to 95°, in particular 90°, within production tolerances. For example, the first side surface and the second side surface have the same surface area, especially within production tolerances, which is larger than the surface area of the first front surface and the second front surface.

The first front surface may be set up to decouple the laser radiation. This means that the radiation passage surface of the semiconductor chip, through which the laser radiation generated during operation emits from the semiconductor chip, may be at the first front surface.

The cladding may cover the semiconductor chip at least in places at the cover surface, the second front surface, the first side surface and the second side surface. In other words, each of these surfaces may be covered at least partially with material from the cladding. It is possible that at least some of these areas are completely covered by the cladding.

The bonding layer on the cladding may extend from the cover surface of the semiconductor chip to the first connection point of the semiconductor laser component. It is possible that the bonding layer on the cover surface of the semiconductor chip is in direct contact with it. For example, the semiconductor chip has a contact surface on its cover surface that can be formed with a metal. The bonding layer may then be in direct contact with the semiconductor chip.

The bonding layer extends from the cover surface of the semiconductor chip via the cladding to the first connection point and electrically conductively connects to the first connection point. It is possible that at least one other electrically conductive element such as a via, or another electrically conductive body is located between the bonding layer and the first connection point. This means that the bonding layer does not have to be in direct physical contact with the first connection point, but can only electrically conductively connect to the first connection point. The first connection point is a part of the component provided for contacting from outside.

For example, the first connection point comprises a contact layer that can be wetted with a solder material or an electrically conductive adhesive for contacting. Via the first connection point, the semiconductor laser component can, for example, be contacted on the n-side or the p-side. For this, the first connection point connects to the semiconductor chip of the semiconductor laser component on the n-side or p-side.

In particular, the bonding layer may pass through an opening in the cladding which completely penetrates the cladding in a direction transverse or perpendicular to a main extension plane of the component.

With the semiconductor laser component described herein, it is possible that the semiconductor laser component comprises one or more semiconductor chips that in particular may be similarly configured. This means that if the semiconductor laser component comprises two or more semiconductor chips, the semiconductor chips are configured to generate laser radiation of the same type, for example, in the same wavelength range with the same pulse duration and/or the same coherence length—particularly within the producing tolerance. Thereby, it is possible that the semiconductor chips of the component electrically connect to each other through the bonding layer and, for example, electrically connect in parallel or in series to each other through the bonding layer.

It is also possible that the semiconductor chip is an edge-emitting semiconductor laser bar at whose front surface laser radiation is emitted at different points. For example, such a semiconductor laser bar can contain two or more emitters which emit laser radiation of the same type.

A semiconductor laser component may be specified, with
a semiconductor chip arranged to emit laser radiation,
a cladding that electrically insulates and covers the semiconductor chip in places, and
a bonding layer that electrically conductively connects the semiconductor chip to a first connection point, wherein
the semiconductor chip comprises a cover surface, a bottom surface, a first front surface, a second front surface, a first side surface and a second side surface,
the first front surface is arranged to decouple the laser beam,
the cladding covers the semiconductor chip at least in places on the cover surface, the second front surface, the first side surface and the second side surface, and
the bonding layer on the cladding extends from the cover surface to the first connection point.

Our semiconductor laser components are in particular free of connecting wires (so-called bond wires). For example, the semiconductor chip of the semiconductor laser component is electrically contacted via a large-area contact on the bottom surface of the semiconductor chip and via the bonding layer, which electrically conductively connects the semiconductor chip to a connection point of the semiconductor laser component. Because a bonding layer is used instead of a contact wire, the semiconductor laser component has a particularly low inductance. This makes the semiconductor laser component particularly suitable for generating particularly short laser pulses. The bonding layer extends on a cladding that supports the bonding layer and provides mechanical and chemical protection for the semiconductor chip.

In addition to the low and easily definable inductance of the component, omission of a wire bonding also has the advantage that the component is characterized by a small component size. In particular, the volume of the component is mainly determined by the volume of the semiconductor chip so that the semiconductor laser component can be a CSP (Chip Scale Package) component. In particular, the component can be characterized by a particularly low component thickness in the direction perpendicular to the main extension plane of the component. For example, the thickness of the component is at most 500 µm, in particular at least 100 µm and at most 350 µm.

Furthermore, the semiconductor laser component is scalable, i.e. it is possible to use several similar semiconductor chips or semiconductor laser bars instead of a single semiconductor chip without fundamental design changes. This makes it possible to specify an overall component with a particularly high output power.

The semiconductor laser component may be surface mountable. This means that the semiconductor laser component can be mounted at its destination using surface mounting technology. For this purpose, the semiconductor laser component may only have electrical connection points arranged on the underside of the component.

The cladding may project beyond the first front surface in a direction perpendicular or transverse to the first front surface. It is possible that the cladding covers the first front surface or that the first front surface is free of the cladding. However, even when the front surface is free of the cladding, the cladding is also guided transversely or vertically beyond the first front surface. In this way, the cladding serves as a mechanical protection of the first front surface and thus of the radiation passage surface of the semiconductor chip due to this projection over the first front surface.

The cladding may completely cover the first front surface and may be transparent to laser radiation. In this example, the first front surface is particularly well protected against chemical and mechanical damage by the cladding. However, the laser radiation does not decouple against air, but first radiates through the part of the cladding arranged on the first front surface. The cladding is formed with a radiation-transmissive material characterized by the lowest possible absorption of the passing laser radiation. For example, the material for laser radiation has a transmittance of at least 90%, in particular of at least 95%, and is transparent to laser radiation.

The cladding may be photostructurable. This means that the cladding may be formed with a photostructurable material. It is possible that the photostructurable material is permeable or impermeable to laser radiation. If the photostructurable material is impermeable to laser radiation, it is possible to use laser technology to remove the area of the cladding that covers the first front surface after the semiconductor chip has been clad.

The photostructurable material can be, for example, a photoresist or a photostructurable siloxane. The siloxane SINR from ShinEtsu, for example, can be used for this purpose. This material is usually used as an adhesive for bonding wafers. This is described, for example, in "Adhesive wafer bonding using photosensitive polymer layers", presented at SPIE-Microtechnologies for the New Millennium, symposia "Smart Sensors, Actuators, and MEMS", May 4-6, 2009, Dresden, Germany, the subject matter of which is incorporated herein by reference with respect to the SINR-Siloxane.

We surprisingly found that a photostructurable siloxane is also suitable for encapsulating semiconductor chips that generate laser radiation during operation. The photostructurable siloxane is a negative resist in which exposed areas cross-link and remain in the product. In this way, the areas remaining in the component can be determined by specific exposure of the photostructurable material.

A photostructurable siloxane is also characterized by the fact that it is permeable to the laser radiation generated in the semiconductor chip and can therefore remain on the first front surface. A disadvantage may be that the material has a high coefficient of thermal expansion of 200 ppm/K, for example. To lower the coefficient of thermal expansion, it is possible to introduce particles of another material, for example, particles of glass, for example, fused silica into the photostructurable material.

In addition to the photostructurable siloxane described above, it is also possible to form the cladding with other materials. For example, the cladding may contain one of the following materials or may be made from one of the following materials: epoxy, silicon oxide, silicon nitride, aluminum oxide. Epoxy in particular is suitable because of its relatively low coefficient of expansion of, for example, 60 ppm/K, which can be reduced to a coefficient of expansion of at most 40 ppm/K by introducing particles of fused silica.

The semiconductor laser component may comprise a carrier in which the first connection point and a second connection point of the component are formed on an underside of the carrier facing away from the semiconductor chip. The carrier can, for example, be a circuit board, a printed circuit board, a ceramic carrier with connection frame parts and vias or leadframe parts. It is advantageous that processing can take place on the carrier during production of the semiconductor laser component. This means, for example, that the carrier can form part of the tool used to apply the cladding around the semiconductor chip.

Alternatively, it is also possible that the component is free of a carrier. For example, a contact surface of the semiconductor chip can be exposed on the underside of the component. This contact surface of the semiconductor chip can, for example, form the second connection point of the semiconductor laser component. In addition, part of the bonding layer exposed at the bottom of the component may form the first contact point. If the semiconductor laser component is free of a carrier, the mechanical stability of the semiconductor laser component is mainly ensured by the cladding or a further casting body. In this example, it may be advantageous that the cladding is formed with a particularly mechanically stable material such as an epoxy, and/or another casting body which may be formed, for example, with an epoxy, is molded onto the cladding and the bonding layer.

The semiconductor laser components described herein can be contacted directly through the first and second contact points. In addition, it is possible that further contact structures such as planar contacts (land grid array, LGA) or solder balls (ball grid array, BGA), are formed at the contact points.

The cladding may border directly on the carrier in places. This is particularly true if the carrier forms part of the casting tool with which the cladding is applied. The contact between the cladding and the carrier also makes it possible for the cladding to be anchored particularly well in the component and reduces the risk of the cladding coming off.

The carrier may comprise a first connection frame part and a second connection frame part. The connection frame parts of the carrier can be, for example, parts of a leadframe formed with an electrically conductive material such as copper. The connection frame parts can be directly adjacent to the cladding and the first connection frame part can electrically connect to the semiconductor chip through the bonding layer.

This means that, with this example, it is particularly possible for the cladding, in addition to its properties as a supporting component for the bonding layer and as a protective component for the semiconductor chip, to ensure the mechanical cohesion of the carrier, in particular the connection frame parts of the carrier. In this example, the use of an epoxy material is particularly suitable for the formation of the cladding since the mechanical stability of the component can be ensured particularly well in this way. It may be necessary for the first front surface of the semiconductor chip to be at least partially free of the cladding to ensure undisturbed emission of laser radiation.

The first connection point of the semiconductor laser component is then formed, for example, by an underside of the first connection frame part facing away from the bonding layer. A second connection point of the semiconductor laser component may be formed by an underside of the second connection frame part facing away from the bonding layer.

The carrier may terminate flush with the cladding in lateral directions. This means that it is possible that the side surfaces of the component that delimit the component laterally outwardly and extend, for example, parallel to the side surfaces and front surfaces of the semiconductor chip, are formed in places by the carrier and the cladding, with the carrier and the cladding terminating flush with each other on the side surfaces and together forming a flat surface on each side surface. In this way, the semiconductor component is particularly compact and can be mounted very easily.

The cladding may cover the carrier and the semiconductor chip in places as a layer of constant thickness. In particular, the cladding then covers the carrier and the semiconductor chip in a conformal manner. In this example in particular, dielectric layers of materials such as silicon oxide, silicon nitride or aluminum oxide can be used to form the cladding. It is also possible that the cladding in this example is formed by photostructurable siloxane. The thickness of the cladding is, for example, at least 1 µm and not more than 30 µm. Due to the small layer thickness, a high coefficient of thermal expansion of the material with which the cladding is formed does not have as strong an effect as in a thicker cladding that does not evenly cover the semiconductor chip but is thicker than the semiconductor chip. This means that for the cladding formed as a thin layer of constant thickness, the thermomechanical stresses acting on the bonding layer are reduced. Furthermore, in this example it is also possible that the first front surface remains free of the material of the cladding so that materials with reduced permeability for the laser radiation can also be used to form the cladding.

The semiconductor component may comprise a casting body that in places borders directly on the cladding and the bonding layer. The casting body can, for example, be a casting body made of epoxy, silicone or another plastic. The casting body may also be present on the first front surface of the semiconductor chip and cover the first front surface of the semiconductor chip. Particularly in the example of a thin, conformal layer to form the cladding and/or if the component is free of a carrier, the casting body can contribute to the mechanical stabilization of the component. In addition, the casting body provides mechanical and chemical protection for the other components of the semiconductor laser component.

We also provide a method of producing a semiconductor laser component described herein. This means that all features disclosed for the semiconductor laser component are also disclosed for the method and vice versa.

In the method, a semiconductor chip is first applied to the carrier. The carrier can be one of the carriers described above, which are used in the finished component for contacting the semiconductor laser. In addition, it is possible that the carrier may be an auxiliary carrier that may be detached after the method has been completed.

In a further method step, the semiconductor chip is covered with the cladding, whereby only the bottom surface of the semiconductor chip remains free of the cladding. The bottom surface of the semiconductor chip faces the carrier and is thus protected by the cladding material.

In a subsequent method step, the cover surface of the semiconductor chip is exposed in places. For example, the cover surface of the semiconductor chip can be exposed by processing a photostructurable cladding material. This means that the cladding material can be removed, for example, by exposure and subsequent etching.

If, for example, a cladding material is an epoxy, it can also be removed by laser radiation, for example, by so-called laser drilling.

In addition, the cladding material can also be selectively removed at other locations to thin or remove the cladding material in the area of the first front surface and provide a way for the subsequent bonding layer to be applied in the direction of the carrier.

In a further method step, the bonding layer is applied to a top side of the cladding facing away from the substrate and to the cover surface of the semiconductor chip.

With this method it is possible that the carrier remains in the component and is used therein for mechanical stabilization and electrical contacting of other components of the component.

It may alternatively be possible to remove the carrier after the semiconductor chip has been encapsulated with the encapsulation. In this way, it is possible that areas of the semiconductor chip, the bonding layer and the cladding are freely accessible on the underside of the component. A component without a carrier is advantageously thin and can be thermally connected directly to the destination, which can facilitate the dissipation of heat during operation of the semiconductor chip. The necessary mechanical stability of the component can then be provided, for example, by a cladding formed with a mechanically resilient material such as epoxy and/or the component contains a casting body described herein which can be used for further stabilization.

One of the features of a semiconductor laser component is that the semiconductor chip can be encased by a radiation-transmissive, transparent photostructurable material, which enables an optical exit window for the laser radiation on the one hand and access to the contact of the semiconductor chip on its cover surface on the other hand. The cladding can conformly cover the semiconductor chip with a small layer thickness. The material can either cover the first front surface of the semiconductor chip, i.e. it is molded onto the first front surface of the semiconductor chip using a casting tool, for example, and can remain there as a radiation-transmissive material or be removed from the front surface as a photostructurable material. This makes it possible to protect the corners and edges of the semiconductor chip with the material and to prevent optical impairment by removing the material from the first front surface.

In the following, the semiconductor laser component and the method described herein are explained in more detail by examples and the associated figures.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

Figure 7A:
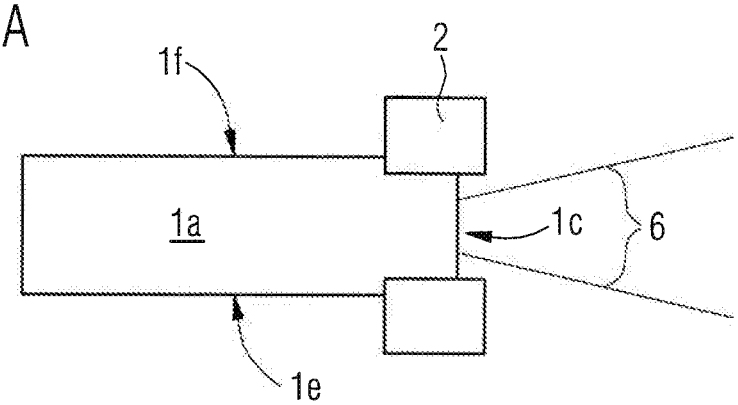
Figure 7B:
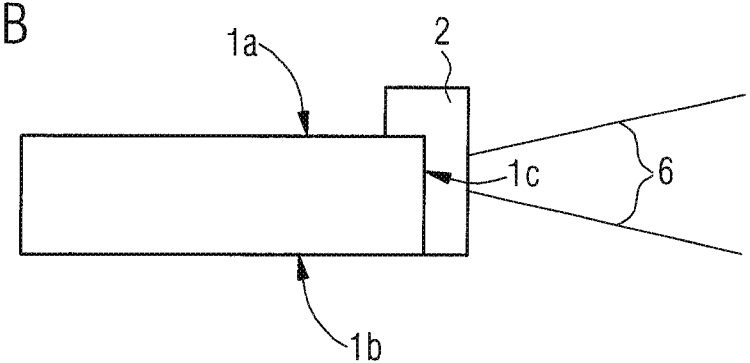
Figure 7C:
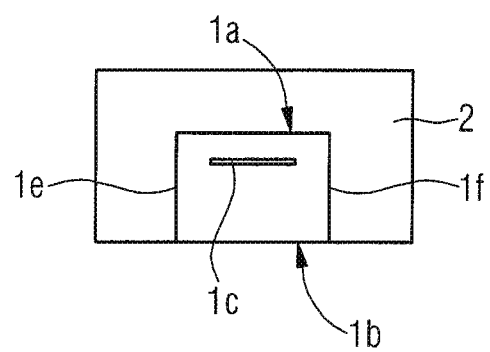

FIG. 1 shows an example of a semiconductor laser component described herein, in a sectional view. The component comprises a semiconductor chip 1. The semiconductor chip 1 is an edge-emitting semiconductor laser chip. Semiconductor chip 1 comprises a cover surface 1a and a bottom surface 1b facing away from cover surface 1a. Furthermore, the semiconductor chip comprises a first front surface 1c and a second front surface 1d facing away from the first front surface 1c. The semiconductor chip also includes a first side surface 1e and a side surface 1f facing away from the first side surface as shown in FIGS. 7A and 7C, for example.

The laser beam 6 leaves the semiconductor chip 1 at the first front surface 1c.

The component also includes a cladding 2. The cladding 2, for example, is formed with a photostructurable siloxane such as SINR with silicone and/or epoxy resin. The cladding 2 covers the semiconductor chip in places on its cover surface 1a. Further, the cladding 2 completely covers the semiconductor chip 1 on the first side surface 1e and the second side surface 1f as well as the second front surface 1d. In the example shown in FIG. 1, the cladding 2 also completely covers the semiconductor chip 1 at the first front surface 1c. The cladding 2 is transparent for the laser radiation 6 and is in particular clear.

At the cover surface 1a the semiconductor chip 1 is in places free of the cladding 2. There the semiconductor chip 1 is in direct mechanical and electrical contact with a bonding layer 3. The bonding layer 3 extends from the cover surface 1a of the semiconductor chip 1 over the cladding 2 and through an opening in the cladding in the direction of a carrier 4.

The carrier 4 has a base body 41 formed with an electrically insulating material. The base body 41 contains vias 42 formed, for example, with electrically conductive material. For example, the vias 42 are formed with electrically conductive solid bodies that may consist of a metal such as copper, or the inner surfaces facing the base body 41 are coated with an electrically conductive material in the area of the vias. The base body 41 can be formed with a plastic, a ceramic material or a glass.

The undersides of the vias 42 facing away from the cladding 2 form the connection points 43a, 43b of the component. The bonding layer 3 electrically conductively connects to a first connection point 43a. The second connection points 43b connect to the underside of the semiconductor chip 1 through the vias 42, where it has a contact surface for electrical contacting.

The bonding layer 3, for example, is formed by a stack of layers with a stacking direction perpendicular to the main extension plane of the component. The layer stack, for example, comprises a layer formed with titanium that can directly adjoin the cladding 2. A layer formed with copper can be arranged on top of this layer. For example, the titanium layer can have a thickness in the range of 100 nm and the copper layer can have a thickness in the range of 1000 μm. On the side of the copper layer facing away from cladding 2, a further copper layer can be applied which has a thickness, for example, in the range of 10 μm. The titanium layer and the first copper layer, for example, are applied by sputtering, the second copper layer can be galvanically deposited. In this way a bonding layer 3 is formed which has a thickness of 10 to 15 μm in the direction perpendicular to the main extension plane of the component.

In the example shown in FIG. 1, the cladding 2 terminates flush with the carrier 4 in the lateral directions, parallel to the main extension plane of the component. The component of FIG. 1 is surface mountable.

In a variant of the component of FIG. 1, the carrier 4 can be removed. In this example, during production, the carrier may be an auxiliary carrier formed, for example, by a plastic material. In this example, the contact surfaces on the underside of the semiconductor chip and the underside of bonding layer 3 form the connection points 43a, 43b for surface mounting the component.

Figure 2:
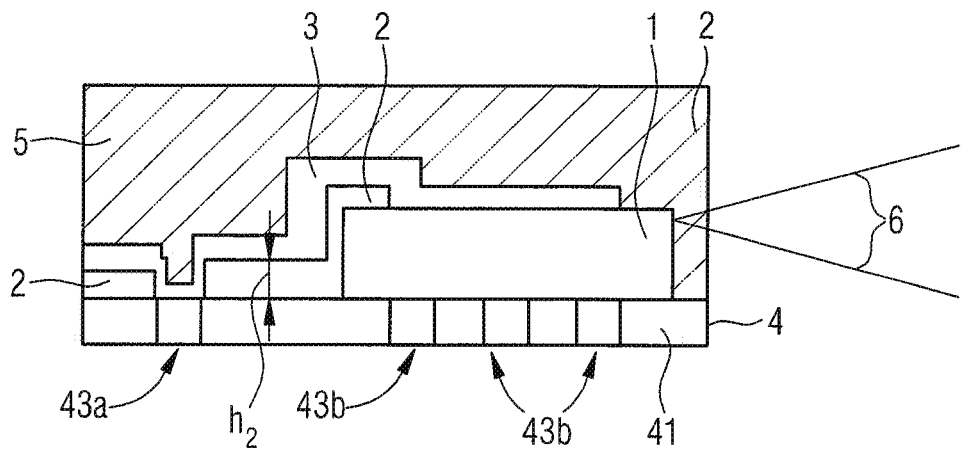

In connection with FIG. 2, a further example is shown in which the cladding 2 is formed as a layer that evenly covers the carrier 4 and the semiconductor chip 1. In this example, cladding 2 is formed with SINR, silicon oxide, silicon nitride, aluminum oxide and/or other oxides or nitrides. In this exemplary example, the cladding 2 can have a thickness of at least 1 μm to at most 30 μm, whereby the thickness is constant within production tolerances. It is possible that no material of the cladding 2 is arranged on the front surface 1c so that materials not permeable to the laser radiation 6 can also be used.

In the example shown in FIG. 2, the component also has a casting body 5 formed, for example, with a silicone. The casting body 5 can, for example, be produced by compression molding. The casting body 5 covers the cladding 2, the carrier 4 and the bonding layer 3. It is used for mechanical stabilization and mechanical and chemical protection of the components of the component.

In particular in this example, it is possible that the carrier 4 is not present. The mechanical stability of the component can then be ensured, for example, by a suitably thick casting body 5.

Figure 3A:
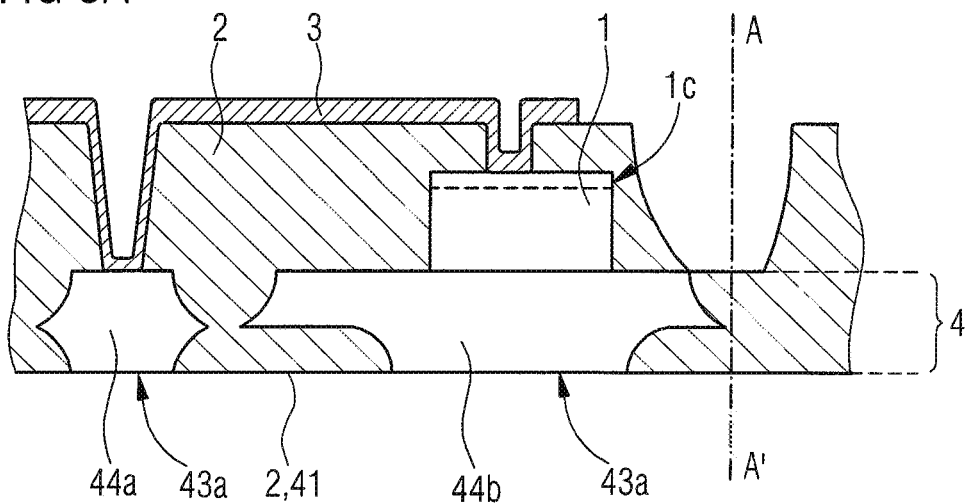
Figure 3B:
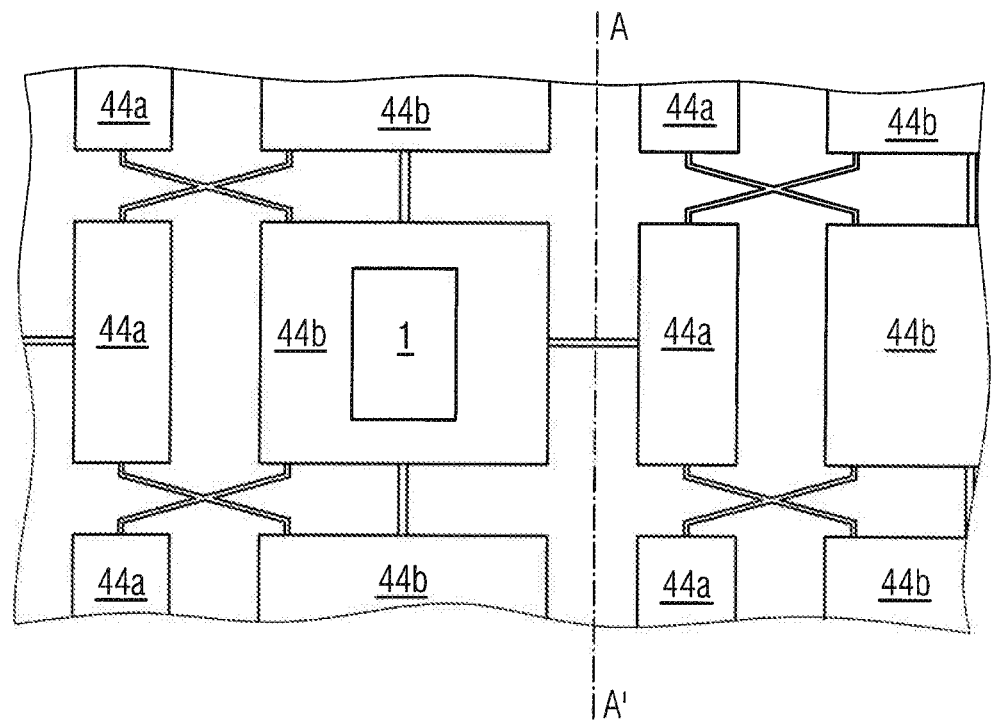

In connection with FIGS. 3A and 3B, an example is described in which the carrier is formed by a first connection frame part 44a and a second connection frame part 44b. As can be seen from FIG. 3B in particular, the connection frame parts 44a, 44b are parts of an etched leadframe. The semiconductor chip 1 is mechanically fastened and electrically connects to the top side of the second connection frame part 44b facing away from the second connection point 43b, for example, by soldering.

In the example shown in FIGS. 3A and 3B, it is possible that the connection frame parts are covered in a planar manner with a cladding material before the semiconductor chip is applied, whereby the top sides of the connection frame parts 44a, 44b facing away from the connection points 43a, 43b remain free of the cladding material. The cladding material may, for example, be an epoxy. These covered connection frame parts can then be used as carrier 4. The same material with which the connection frame parts 44a, 44b are covered can then also be used as cladding 2.

Alternatively, it is possible for the cladding 2 to take place after assembly of the semiconductor chip 1 and for the cladding 2 to also surround the connection frame parts 44a, 44b in the lateral direction so that the connection frame parts border directly on the cladding. Cladding 2 thus mechanically connects the connection frame parts 44a, 44b to each other to cover the semiconductor chip 1 and as a carrier for application of the bonding layer 3. This means in particular that the cladding also forms the base body 41 of the carrier 4.

The first connection frame part 44a electrically connects to the semiconductor chip 1 by bonding layer 3. As indicated in FIG. 3B, a plurality of such semiconductor laser components can be produced in a leadframe composite and, after cladding with cladding 2, can be cut into individual components.

Figure 4:
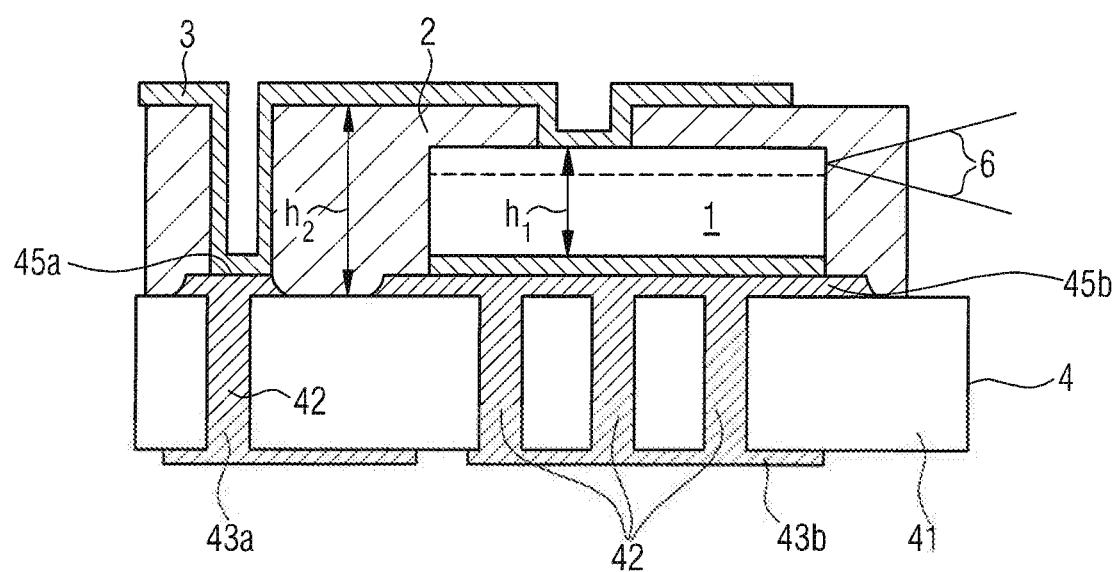

In connection with the schematic sectional view of FIG. 4, another example of a semiconductor laser component is explained in more detail. In this example, carrier 4 is formed, for example, by a printed circuit board or a ceramic carrier. The carrier 4 has vias 42 that electrically connect a first contact point 54a on the top side of the carrier to the first connection point 43a and electrically connect a second contact point 45b to the second connection point 43b. The example in FIG. 4 shows that the cladding projects beyond the semiconductor chip 1 in a direction perpendicular to the main extension plane of the semiconductor device. For example, cladding 2 has a thickness h2 at least 10 μm thicker than semiconductor chip 1, in particular at least 40 μm thicker than semiconductor chip 1. For example, semiconductor chip 1 has a thickness h1 of 110 μm and the cladding 2 has a thickness h2 of 150 μm.

Figure 5:
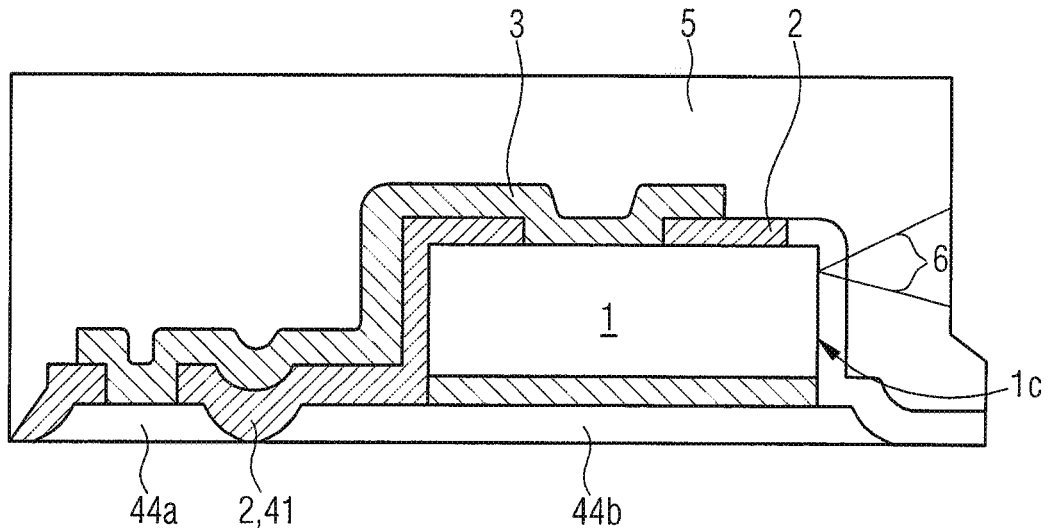

In connection with the schematic cross-sectional view of FIG. 5, another example of a component described herein is explained in more detail. In this example, cladding 2 is provided as a conformal layer, which also serves as the base body 41 of the carrier 4 and mechanically connects the connection frame parts 44a, 44b to each other. For mechanical stabilization, the component in the example in FIG. 5 comprises the casting body 5 that can be beveled on its side facing the side surface 1c to provide an oblique radiation exit surface for the laser beam 6.

Figure 6:
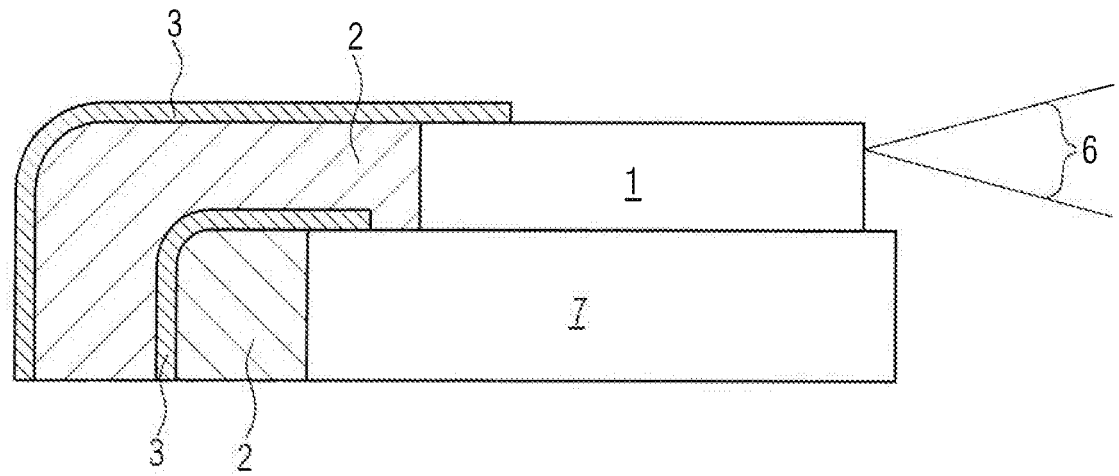

A section from another example of a semiconductor laser component is explained in more detail in connection with FIG. 6. In the example in FIG. 6, the semiconductor laser 1 is mounted on a mounting element 7 (submount). The mounting element 7 can, for example, serve as a heat spreader and be formed with a ceramic or a metallic material. Mounting element 7 can electrically connect to semiconductor chip 1 and electrically connect via a further bonding layer 3' that is identical or similar to the bonding layer 3. In this example, it is possible that the mounting element 7 is electrically insulating and that an electrical connection is established between the further bonding layer 3' and the semiconductor chip 1 via an electrically conductive layer between the mounting element 7 and the semiconductor chip 1. Alternatively, the mounting element 7 can be electrically conductive and the further bonding layer 3' can be omitted. A mounting element 7 can be used in any configuration of the semiconductor laser component.

Another example of a semiconductor laser component is explained in more detail in connection with FIGS. 7A, 7B, and 7C. In this example, the first front surface 1c is free from cladding material 2 and, for example, is removed from the front surface after the cladding material 2 has been applied. However, in a direction perpendicular to the front surface 1c, the cladding material 2 projects beyond the front surface 1c to provide mechanical protection of the front surface. FIG. 7A shows a schematic view of the cover surface 1a of the semiconductor chip 1. FIG. 7B shows a schematic side view and FIG. 7C shows a top view of the front surface 1c.

In connection with FIGS. 8A to 8D, an example of a method of producing a semiconductor laser component described herein is explained in more detail.

Figure 8A:
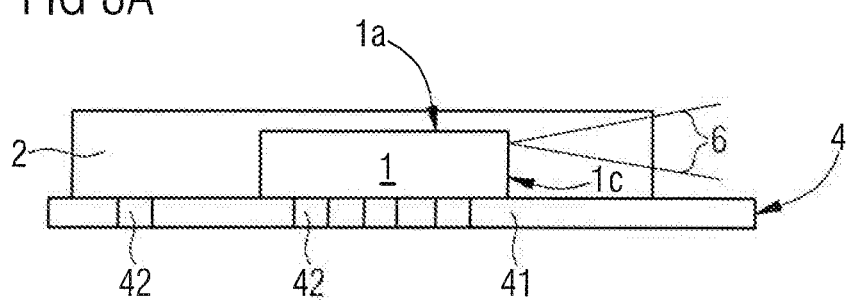
FIGS. 8A, 8B, 8C and 8D illustrate schematic sections of an example of the method.

In a first method step, FIG. 8A, a semiconductor chip 1 is applied to a carrier 4 comprising, for example, vias 42 surrounded by a base body 41. Alternatively, carrier 4 may be an auxiliary carrier that does not include electrically conductive structures. Subsequently, a cladding 2, for example, a photostructurable siloxane, a silicone or an epoxy, is applied over the semiconductor chip 1 and the carrier 4. The layer thickness of cladding 2 is greater than that of the chip so that the cladding 2 projects beyond the chip.

Figure 8B:
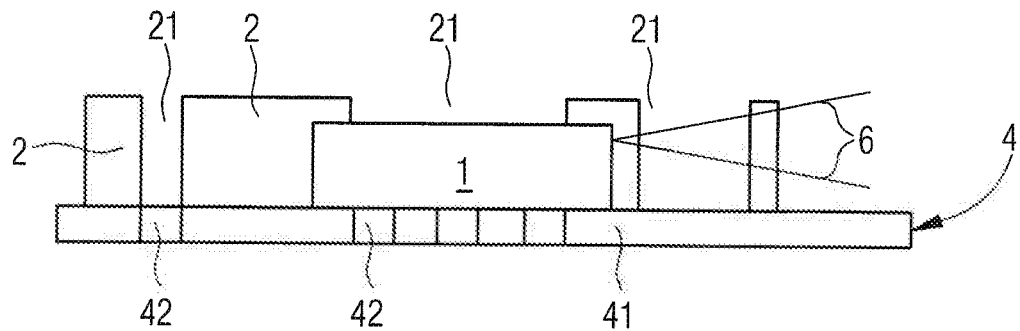

In the next method step, FIG. 8B, the cladding 2 is removed in places, creating openings 21 in cladding 2. For example, openings 21 can be made in a photostructurable material by exposure, development and etching. For other materials, for example, the use of a laser ablation process such as laser drilling is possible.

Figure 8C:
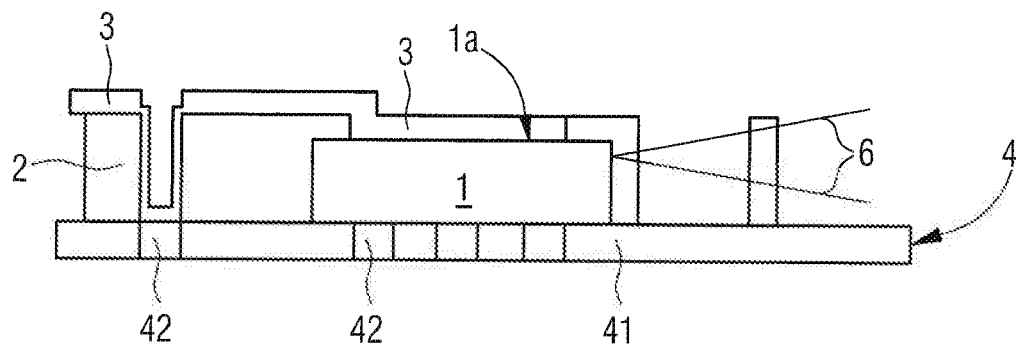

In the next method step, FIG. 8C, the bonding layer 3 is applied evenly to the cover surface 1a of the semiconductor chip 1 and the top side of the cladding 2 facing away from the carrier 4. The bonding layer may pass through one of the openings 21 in the cladding 2 that completely penetrates the cladding 2 in a direction transverse or perpendicular to a main extension plane of the component.

Figure 8D:
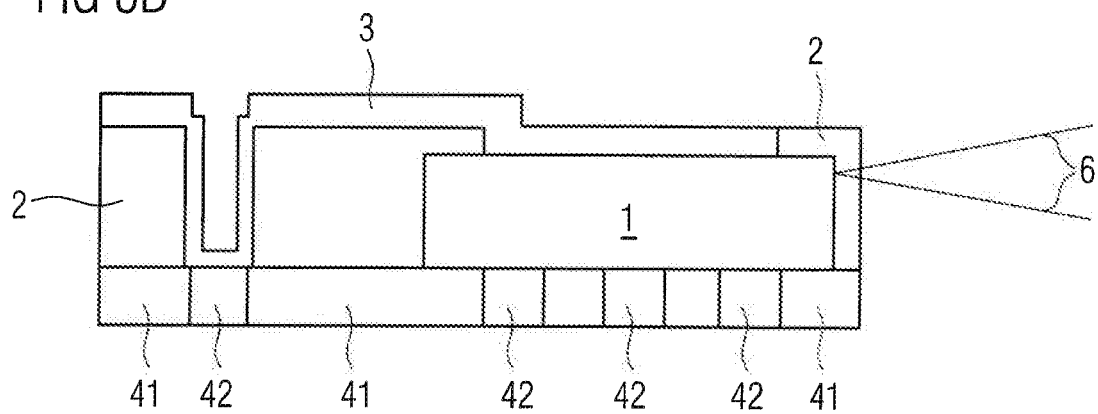

In the final method step, FIG. 8D, singulation takes place. Singulation takes place, for example, by sawing or laser separation. The method is used, for example, to produce a component as described in FIG. 1.

Alternatively, the carrier 4 can be removed after completion of the method so that a surface-mountable component without carrier is produced. Furthermore, modifications of the method are possible which lead to components as shown in connection with the other examples.

This application claims priority of DE 102017112223.0, the subject matter of which is incorporated herein by reference.

Our components and methods are not limited by the description of the examples. Rather, this disclosure includes any new feature and any combination of features, which in particular includes any combination of features in the appended claims, even if the feature or combination itself is not explicitly mentioned in the claims or the examples.

What is claimed is:

1. A semiconductor laser component comprising:
   a semiconductor chip arranged to emit laser radiation;
   a cladding that is electrically insulating and covers the semiconductor chip in places; and
   a bonding layer that electrically conductively connects the semiconductor chip to a first connection point, wherein
   a) the semiconductor chip comprises a cover surface, a bottom surface, a first front surface, a second front surface, a first side surface and a second side surface, and the first front surface is arranged to decouple the laser, radiation;
   b) the cladding covers the semiconductor chip at least in places on the cover surface, the second front surface, the first side surface and the second side surface; and
   c) the bonding layer on the cladding extends from the cover surface to the first connection point.

2. The semiconductor laser component according to claim 1 that is surface mountable.

3. The semiconductor laser component according to claim 1, wherein the cladding projects beyond the first front surface in a direction perpendicular to or transverse to the first front surface.

4. The semiconductor laser component according to claim 1, wherein the cladding covers the first front surface at least in places.

5. The semiconductor laser component according to claim 1, wherein the cladding completely covers the first front surface and is transparent to the laser radiation.

6. The semiconductor laser component according to claim 1, wherein the cladding is photostructurable.

7. The semiconductor laser component according to claim 1, further comprising a carrier, wherein the first connection point and a second connection point are formed on an underside of the carrier facing away from the semiconductor chip.

8. The semiconductor laser component according to claim 7, wherein the cladding borders directly on the carrier in places.

9. The semiconductor laser component according to claim 7, wherein
   the carrier comprises a first connection frame part and a second connection frame part,
   the connection frame parts directly adjoin the cladding and are surrounded in lateral directions by the cladding, and
   the first connection frame part electrically conductively connects to the semiconductor chip through the bonding layer.

10. The semiconductor laser component according to claim 7, wherein the carrier terminates flush with the cladding in lateral directions.

11. The semiconductor laser component according to claim 7, wherein the cladding partially covers the carrier and the semiconductor chip as a layer of constant thickness in a conformal manner.

12. The semiconductor laser component according to claim 1, wherein a casting body in places borders directly on the cladding and the bonding layer.

13. The semiconductor laser component according to claim 1 that is free of a carrier, wherein a second contact point is formed on the bottom surface of the semiconductor chip.

14. A method of producing a semiconductor laser component comprising:
1) mounting a semiconductor chip on a carrier;
2) covering the semiconductor chip with a cladding, whereby only a bottom surface of the semiconductor chip remains free of the cladding;
3) exposing a cover surface of the semiconductor chip in places; and
4) applying a bonding layer to a top side of the cladding facing away from the carrier and to the cover surface of the semiconductor chip,
wherein the carrier is detached.

15. The method according to claim 14, wherein the cladding projects beyond the first front surface in a direction perpendicular to or transverse to the first front surface.

16. The method according to claim 14 that produces a semiconductor laser component comprising:
a semiconductor chip arranged to emit laser radiation,
a cladding that is electrically insulating and covers the semiconductor chip in places, and
a bonding layer that electrically conductively connects the semiconductor chip to a first connection point, wherein
the semiconductor chip comprises a cover surface, a bottom surface, a first front surface, a second front surface, a first side surface and a second side surface,
the first front surface is arranged to decouple the laser beam,
the cladding covers the semiconductor chip at least in places on the cover surface, the second front surface, the first side surface and the second side surface, and
the bonding layer on the cladding extends from the cover surface to the first connection point.

17. A semiconductor laser component comprising:
a semiconductor chip arranged to emit laser radiation;
a cladding that is electrically insulating and covers the semiconductor chip in places; and
a bonding layer that electrically conductively connects the semiconductor chip to a first connection point, wherein
a) the semiconductor chip comprises a cover surface, a bottom surface, a first front surface, a second front surface, a first side surface and a second side surface, and the first front surface is arranged to decouple the laser radiation;
b) the cladding covers the semiconductor chip at least in places on the cover surface, the second front surface, the first side surface and the second side surface, and the cladding projects beyond the first front surface in a direction perpendicular to or transverse to the first front surface; and
c) the bonding layer on the cladding extends from the cover surface to the first connection point.

* * * * *